United States Patent
Young (10) Patent No.: US 7,673,272 B1
(45) Date of Patent: Mar. 2, 2010

(54) METHOD AND APPARATUS FOR GENERATING AN AREA CONSTRAINT FOR A MODULE IN A PROGRAMMABLE LOGIC DEVICE

(75) Inventor: Jay T. Young, Louisville, CO (US)

(73) Assignee: Xilinx, Inc., San Jose, CA (US)

( * ) Notice: Subject to any disclaimer, the term of this patent is extended or adjusted under 35 U.S.C. 154(b) by 401 days.

(21) Appl. No.: 11/707,318

(22) Filed: Feb. 16, 2007

(51) Int. Cl.
*G06F 17/50* (2006.01)
(52) U.S. Cl. .......................................... 716/16; 716/17
(58) Field of Classification Search .............. 716/16–17
See application file for complete search history.

(56) References Cited

U.S. PATENT DOCUMENTS 5,822,214 A * 10/1998 Rostoker et al. .............. 716/10
6,817,005 B2    11/2004 Mason et al.
7,149,993 B1 * 12/2006 Aggarwal et al. ............. 716/8
2005/0229140 A1 * 10/2005 Tsai et al. ..................... 716/17

OTHER PUBLICATIONS

Xilinx, Inc., U.S. Appl. No. 11/238,433 by Mason et al. filed Sep. 28, 2005.

* cited by examiner

*Primary Examiner*—Stacy A Whitmore
(74) *Attorney, Agent, or Firm*—Robert M. Brush (57) ABSTRACT

Method and apparatus for generating an area constraint for a module in a programmable logic device (PLD) is described. In an example, first logic resources are selected in a floorplan of the PLD for implementing a first module of a circuit design. A routing resource area constraint is defined that reserves first routing resources associated with the first logic resources and second routing resources associated with second logic resources. The second routing resources are required for use of the first logic resources. A logic resource area constraint is defined that reserves the first logic resources and excludes the second logic resources. The logic resource constraint area for the module may be non-rectangular or include multiple disjoint regions.

20 Claims, 9 Drawing Sheets

METHOD AND APPARATUS FOR GENERATING AN AREA CONSTRAINT FOR A MODULE IN A PROGRAMMABLE LOGIC DEVICE

FIELD OF THE INVENTION

One or more aspects of the invention relate to programmable logic devices (PLDs) and, more particularly, to a method and apparatus for generating an area constraint for a module in a PLD.

BACKGROUND

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

Presently, a final circuit design (referenced herein as the top-level design) for a PLD may include many logic pieces (referenced herein as modules). All of the logic pieces may be implemented at one time to form a full implementation for a target PLD. Alternatively, each module may be designed and implemented separately. Implemented modules are then combined to form a full implementation for a target PLD. In addition, some PLDs support dynamic reconfiguration while active. That is, some PLDs have the ability to re-program a portion of the PLD while the rest of the PLD continues to operate normally.

In modular design flows, areas in the floorplan of the PLD are specified for module implementation. Conventionally, the areas are specified by defining a rectangular area on the floorplan of the PLD where the logic and routing of the module is to be implemented. Specifying such areas (referred to as "area constraints") may be accomplished by manual layout and/or utilizing floorplanning tools. This process has worked fairly well in the past, but has begun to yield sub-optimal use in newer PLD architectures.

Present FPGAs, for example, now incorporate special purpose logic within the fabric, such as block random access memories (BRAMs), digital signal processors (DSPs), first-in-first-out memories (FIFOs), microprocessors, and the like, as well as a whole set of specific function cores. Such special purpose logic may exist in columns throughout the fabric of the device, or may just exist by creating a "hole" in the fabric of the device. A "hole" is defined as some logic that replaces a piece of one or more columns and/or rows of the general fabric logic (e.g., CLBs). As such, it is becoming difficult to define a rectangular area that contains logic that a module implementation requires without encompassing special purpose logic or other general purpose logic interspersed in the fabric that the module does not need. Accordingly, there exists a need in the art for an improved method and apparatus for modular circuit design for PLDs having special purpose logic in the fabric.

SUMMARY

An aspect of the invention relates to implementing a circuit design for a programmable logic device (PLD). First logic resources are selected for implementing a first module of the circuit design. A logic resource area constraint is defined that reserves a non-rectangular region in a floorplan of the PLD having the first logic resources. A routing resource area constraint is defined that reserves first routing resources associated with the first logic resources in the non-rectangular region. By defining a non-rectangular region for logic and routing of a module, non-essential logic and routing that would otherwise be included in a rectangular region may be conserved and used for other modules.

In an embodiment, the routing resource area constraint is further defined to reserve second routing resources associated with second logic resources, where the second routing resources are required for use of the first routing resources. The second logic resources, however, are excluded from the non-rectangular region. In an embodiment, at least a portion of the second logic resources is reserved for implementing a second module of the circuit design. For example, the first module may comprise a reconfigurable module and the second module may comprise a static portion of the circuit design.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION OF THE DRAWINGS

Figure 1:
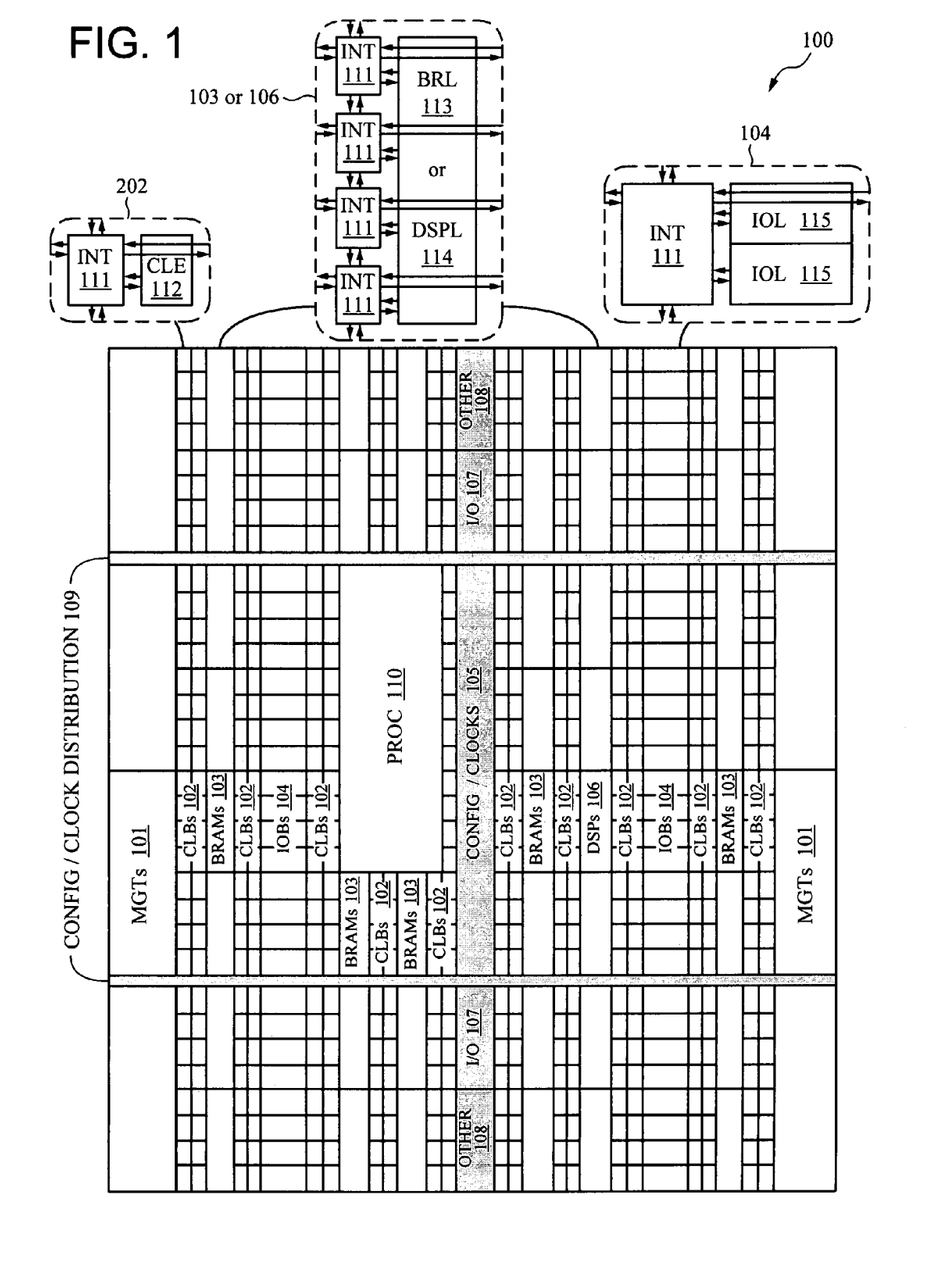
FIG. 1 illustrates an exemplary FPGA architecture.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections via routing conductor segments to and from a corresponding interconnect element in each adjacent tile. Therefore, the programmable interconnect elements and routing conductor segments taken together implement the programmable interconnect structure for the illustrated FPGA. The programmable interconnect element (INT 111) also includes the connections to and from the programmable logic element within the same tile, as shown by the examples included at the top of FIG. 1. The programmable interconnect element (INT 111) may also include connections via routing conductor segments to and from a corresponding interconnect element that span multiple columns of logic. That is, routing conductor segments may span a plurality of tiles (e.g., a "hex" line spans six tiles).

For example, a CLB 102 can include a configurable logic element (CLE 112) that can be programmed to implement user logic plus a single programmable interconnect element (INT 111). In an embodiment, the CLE 112 includes four slices (not shown) of logic. A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs is typically included wherever the CLBs appear, to facilitate the efficient implementation of user logic. Examples of FPGAs that may be used with embodiments of the invention are the Virtex 4 FPGAs available from Xilinx, Inc., of San Jose, Calif.

Figure 2:
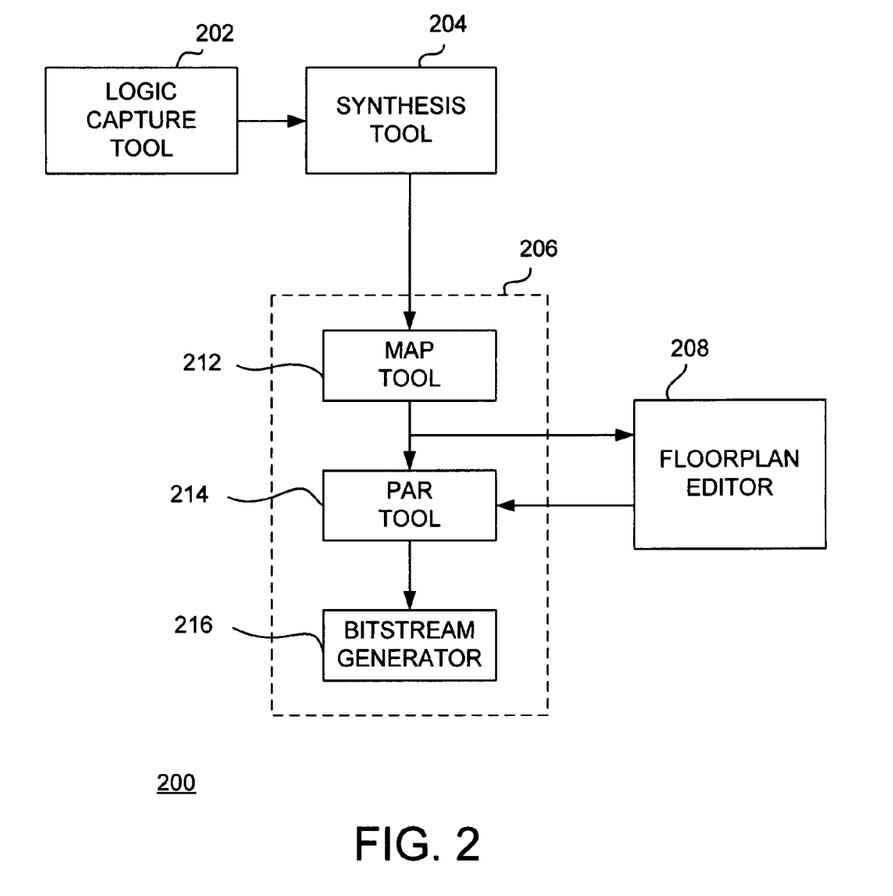
FIG. 2 is a block diagram depicting an exemplary embodiment of a circuit design system in accordance with one or more aspects of the invention.

FIG. 2 is a block diagram depicting an exemplary embodiment of a circuit design system 200 in accordance with one or more aspects of the invention. The circuit design system 200 includes a logic capture tool 202, a synthesis tool 204, a floorplan editor 208, and an implementation tool 206. In an embodiment, the system 200 is configured to implement a circuit design for a target FPGA. Accordingly, the implementation tool 206 includes a map tool 212, a place-and-route (PAR) tool 214, and a bitstream generator 216. In an embodiment, the system 200 is implemented using a programmed computer 900 shown in FIG. 9 and described below. Notably, the tools may be part of one or more software programs stored in a memory and configured for execution by a processor.

The logic capture tool 202 is configured to capture a circuit design from a user and generate a behavioral description of the circuit design. The behavioral description includes a plurality of circuit components, such as flip-flops, memories, LUTs, logic gates, and the like, connected together via signal conductors (nets). The logic capture tool 202 may include a graphic interface through which a designer connects symbols and blocks representing various components to produce a schematic description of the circuit design. Additionally or alternatively, the logic capture tool 202 may include a text interface through which a designer writes hardware description language (HDL) code to produce a structural and/or behavioral description of the circuit design in terms of HDL constructs. Examples of HDLs include the Very High-Speed Integrated Circuit HDL (VHDL) and VERILOG.

The circuit design comprises a top-level design having a plurality of modules. In an embodiment, one or more of the modules are reconfigurable modules, and the remaining modules form the static portion of the circuit design. A reconfigurable module is capable of partial dynamic active reconfiguration when the target FPGA is active via a partial reconfiguration process. Once the target FPGA is active, the static portion is fixed and cannot be reconfigured. Logic and routing for a reconfigurable module is restricted to be within a pre-defined area in the floorplan of the target FPGA ("area constraint"). The area constraint for a given module reserves logic and routing resources of the FPGA for implementing the module. In an embodiment, the area constraint for a module includes separate constraints for logic resources and routing resources ("logic resource area constraint" and "routing resource area constraint"). As discussed below, differentiating between logic resource and routing area constraints allows for use of non-rectangular and disjoint implementation regions for modules. This allows modular circuit designs to more efficiently use the FPGA fabric having holes for various special-purpose logic elements. The static portion of the circuit design is implemented prior to implementation of the reconfigurable module(s). The reconfigurable module implementation(s) is/are aware of the static design implementation.

The synthesis tool 204 is configured to receive the behavioral description. The synthesis tool 204 processes the behavioral description to produce a logical description of the circuit design. The logical description includes a logical network list ("netlist") of lower-level circuit elements and logic gates, as well as connections (nets) between inputs and outputs thereof, in terms of the hierarchy specified in the behavioral description. For example, the logical description may be compliant with the Electronic Design Interchange Format (EDIF). The synthesis tool 204 may also generate constraint data associated with the logical description that includes various timing and layout constraints. Alternatively, the logical description may be annotated with such constraint data. Such an annotated netlist is produced, for example, by the XST synthesis tool, commercially available from Xilinx, Inc., of San Jose, Calif.

The map tool 212 is configured to receive the logical description from the synthesis tool 204. The map tool 212 also obtains constraints (which may be annotated in the logical description, for example). The map tool 212 maps the logical description onto physical resources in the target FPGA (i.e., the circuit components, logic gates, and signals are mapped onto LUTs, flip-flops, clock buffers, I/O pads, and the like of the target FPGA). The map tool 212 produces a mapped circuit description in accordance with the established constraints. The mapped circuit description includes groupings of the physical resources of the target FPGA expressed in terms of CLBs and IOBs that include these resources. The mapped circuit description may be annotated with the constraint data.

The PAR tool 214 is configured to receive the mapped circuit description. The PAR tool 214 also obtains constraints (which may be annotated in the mapped circuit description for example). The PAR tool 214 determines placement for the physical resource groupings of the mapped circuit description in the target FPGA and apportions the appropriate routing resources. The PAR tool 214 performs such placement and routing in accordance with the established constraints. The PAR tool 214 produces physical design data. The bitstream generator 216 is configured to receive the physical design data and produce bitstream data for the target FPGA.

The floorplan editor 208 receives the mapped circuit description. The floorplan editor 208 is configured to generate area constraints that may be used by the PAR tool 214 to control placement and routing. The floorplan editor 208 may comprise a graphical tool that gives a designer control over the location of circuit components of a logic design in the target FPGA. In particular, the floorplan editor 208 allows a designer to locate the modules of the circuit design in a floorplan of the target FPGA. The floorplan editor 208 may also automatically locate the modules of the circuit design, after which a designer may manually re-locate or otherwise modify the positioning of the modules as appropriate. In an embodiment, the floorplan editor 208 displays a hierarchical representation of the circuit design in a window of a graphic interface using hierarchy structure lines and colors to distinguish the different hierarchy levels. The window displays the floorplan of the target FPGA and allows the designer to draw areas into which the designer places logic from the hierarchy. The floorplan editor 208 generates various constraints, including area constraints that provide positions and ranges of the modules.

Figure 3:
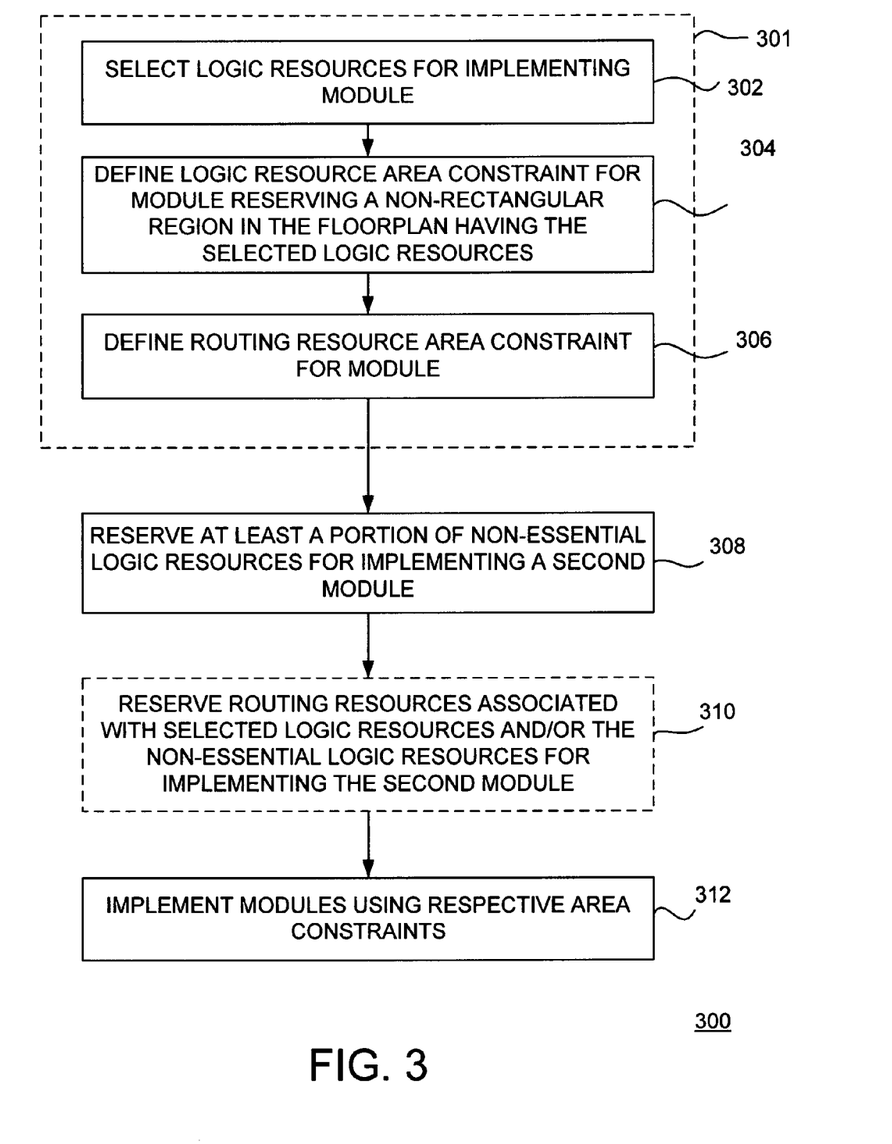
FIG. 3 is a flow diagram depicting an exemplary embodiment of a method of implementing a circuit design for a PLD in accordance with one or more aspects of the invention.

FIG. 3 is a flow diagram depicting an exemplary embodiment of a method 300 of implementing a circuit design for a PLD in accordance with one or more aspects of the invention. The method 300 includes a method 301 for generating an area constraint for a module in accordance with one or more aspects of the invention. In an embodiment, the module is a reconfigurable module in the circuit design. The method 301 may be performed, for example, by the floorplan editor 208. The method 301 begins at step 302, where a group of logic resources is selected for implementing the module. This may be done automatically by the floorplan editor 208 based on the requirements of the module in the mapped circuit description. A designer may manually interact with the floorplan editor 208 to select the logic resources. Alternatively, the logic resources may be selected by a combination of automatic and manual interactions.

At step 304, a logic resource area constraint is defined that reserves a non-rectangular region in the floorplan having the selected logic resources. In an embodiment, the logic resource area constraint is automatically defined by the floorplan editor 208 in response to the selection of the logic resources at step 302. The non-rectangular region may be a contiguous collection of resources or comprise disjoint regions of resources. Exemplary non-rectangular regions are described below. The non-rectangular region allows logic resources not needed for implementing the module that would otherwise be included in a rectangular region to be conserved and used for other modules (these logic resources are referred to herein as "non-essential logic resources"). For example, non-essential logic resources may include special-purpose logic, such as a BRAM, that is embedded among the selected resources.

At step 306, a routing resource area constraint is defined. In an embodiment, the routing resource area constraint is automatically defined by the floorplan editor 208 in response to the selection of the logic resources at step 302. The routing resource area constraint reserves routing resources associated with the selected logic resources. In an embodiment, the routing resource area constraint defaults to reserving routing resources in the non-rectangular region of the logic resource area constraint. That is, as described above, each programmable tile of an FPGA includes programmable interconnect elements. The routing resource area constraint may include at least a portion of the programmable interconnect elements associated with the tiles in the non-rectangular region having the selected logic resources. As described below, in some embodiments, some of the routing resources in the non-rectangular region may be reserved for another portion of the design (e.g., a static portion) despite being associated with the selected logic resources. Such routing resources are not included in the routing resource area constraint. In other embodiments, all of the routing resources in the non-rectangular area are reserved for the module.

In some embodiments, the routing resource area constraint must reserve some routing resources outside of the non-rectangular region encompassing the selected logic resources. For example, the routing resource area constraint may reserve routing resources associated with non-essential logic resources. As discussed below, such routing resources may be required to meet timing requirements or even to route the module logic at all. For example, if the non-rectangular region comprises two disjoint regions, some routing resources associated with logic disposed between the two disjoint regions must be reserved for the module in order to route between the disjoint regions. Accordingly, the routing resource area constraint may be visualized as a superset of the logic resource area constraint. The routing resource area constraint and the logic resource area constraint collectively comprise an area constraint for the module. The method 301 may be performed for one or more modules in a circuit design.

For purposes of clarity by example, assume an area constraint is generated by the method 301 for a first module. Assume further that the non-rectangular region defined by the logic resource area constraint excludes some non-essential logic resources. The method 300 proceeds to step 308, where at least a portion of the non-essential logic resources is reserved for implementing a second module of the circuit design. For example, the non-rectangular region may include two disjoint regions of CLBs with a BRAM disposed in between. The BRAM is not required to implement the module and is thus not reserved by the logic resource area constraint. The BRAM may be used, however, in the implementation of a second module of the circuit design.

In an embodiment, the first module is a reconfigurable module and the second module comprises a static portion of the circuit design. At optional step 310, routing resources associated with the selected logic resources at step 302 and/or the non-essential logic resources are reserved for use by the second module to access the non-essential logic resources. For example, in some cases, routing resources for the first module exist between the second module and the non-essential logic resources. Thus, in an embodiment, one or more of the routing resources associated with the selected logic resources for the first module are reserved for use by the second module. In another embodiment, one or more routing resources associated with the non-essential logic resources are reserved for use by the second module. In yet another embodiment, a combination of routing resources associated with the selected logic resources and the non-essential logic resources are reserved for use by the second module.

At step 312, the first and second modules are implemented (e.g., placed-and-routed) using their respective area constraints. If the second module comprises the static portion of the design and the first module is a reconfigurable module, the second module is implemented prior to implementation of the first module. As described above, the static portion (second module) may utilize some routing resources associated with logic resources reserved for the reconfigurable module (first module). The implementation process for the reconfigurable module (first module) must account for the use of such logic resources by the static portion (second module).

For clarity, the method 300 as been described with respect to a first module and a second module. In general, an area constraint may be generated by the process 301 for each of one or more modules. Each area constraint comprises a non-rectangular region of logic and routing. Through definition of these non-rectangular regions, some non-essential logic resources are defined as described above. At least a portion of these non-essential logic resources may be reserved for use by an additional module at step 308. In an embodiment, the one or more modules are each a reconfigurable module and the additional module is the static portion of the circuit design. Routing resources associated with logic resources reserved for the one or more modules and/or routing resources associated with the non-essential logic resources may be reserved for use by the additional module at step 310. The one or more modules and the additional module may be implemented at step 312. If the additional module is the static portion of the circuit design, the additional module is implemented prior to implementation of the one or more modules (reconfigurable modules).

Figure 4:
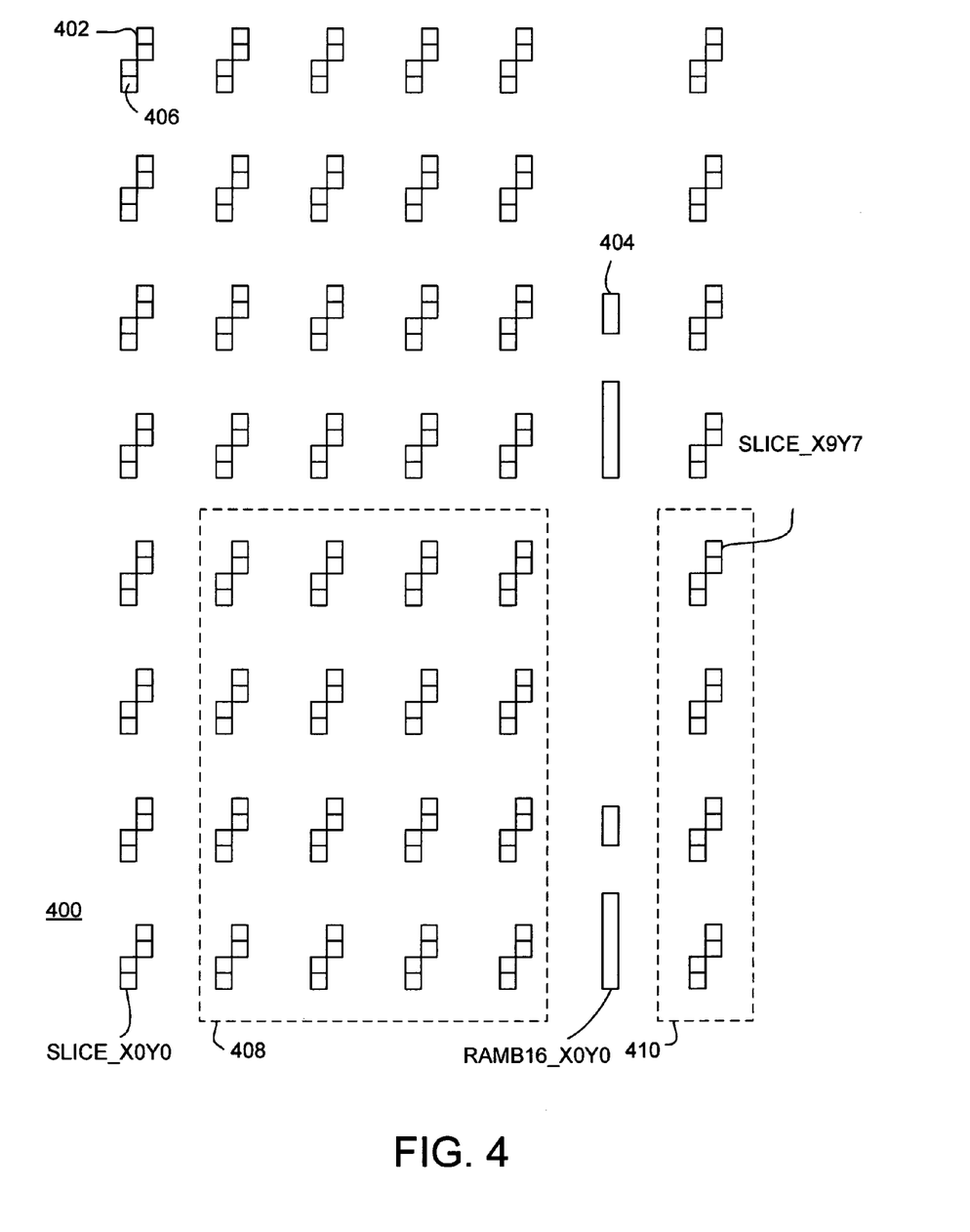
FIG. 4 is a block diagram depicting an exemplary floorplan portion for an FPGA in accordance with one or more aspects of the invention.

The methods 300 and 301 described above may be understood with reference to the following examples. FIG. 4 is a block diagram depicting an exemplary floorplan portion 400 for an FPGA in accordance with one or more aspects of the invention. The floorplan portion 400 includes six columns of CLBs 402 and one column of BRAM 404. Each of the CLBs 402 is two slices wide by two slices tall, for a total of four slices 406 per CLB 402. Each BRAM 404 is as wide as a CLB 402, but is four CLBs 404 tall (eight slices 406 tall). A range of slices may be selected to implement a given module. In the present example, the range SLICE_X0Y0:SLICE_X9Y7 describes a range of slices utilizing a lower left slice and an upper right slice. The BRAM designated as RAMB16_X0Y0 is not required to implement the module. Accordingly, a logic resource area constraint for the module is defined as a non-rectangular region encompassing the slices in the range SLICE_X0Y0:SLICE_X9Y7. The logic resource area constraint comprises two disjoint regions 408 and 410, one on either side of the BRAM RAMB16_X0Y0. The BRAM RAMB16_X0Y0 is in effect excluded from the logic resource area constraint and thus can be used by another portion of the circuit design (e.g., the static portion).

A routing resource area constraint for the module is defined to include routing resources associated with the slices in the slice range SLICE_X0Y0:SLICE_X9Y7, as well as routing resources associated with the BRAM RAMB16_X0Y0. At least a portion of the programmable interconnect associated with the RAMB16_X0Y0 tile is required to be able to route the module across the RAMB16_X0Y0 tile, and thus is included in the routing resource area constraint for the module. A remaining portion of the programmable interconnect associated with the RAMB16_X0Y0 tile may be reserved for another portion of the circuit design that utilizes the RAMB16_X0Y0 tile. In some cases, a portion of the programmable interconnect associated with the slices in the slice range SLICE_X0Y0:SLICE_X9Y7 may also be reserved for another portion of the circuit design.

Notably, as described above, current FPGA routing fabrics support routing resources that span multiple columns of the device. Thus, it is possible to have a logic resource area constraint for a module comprising disjoint areas as shown in FIG. 4, since the routing can jump across the gap from one area to another. However, as the distance between disjoint areas increases, the number of routing resources that span such a distance generally decreases. Small numbers of columns (e.g., 1 to 3) are more easily handled than larger spans. Thus, in an embodiment, the distance between disjoint regions of a logic resource area constraint is less than a threshold distance. The threshold distance may be measured in terms of columns of tiles in the device. These routing constraints can also apply to routing between non-essential logic resource(s) and the static portion of the design. That is, the static design routing must jump across the area defined for the reconfigurable module in order to reach non-essential resource(s) excluded form the logic resource area constraint for the reconfigurable module.

Figure 5:
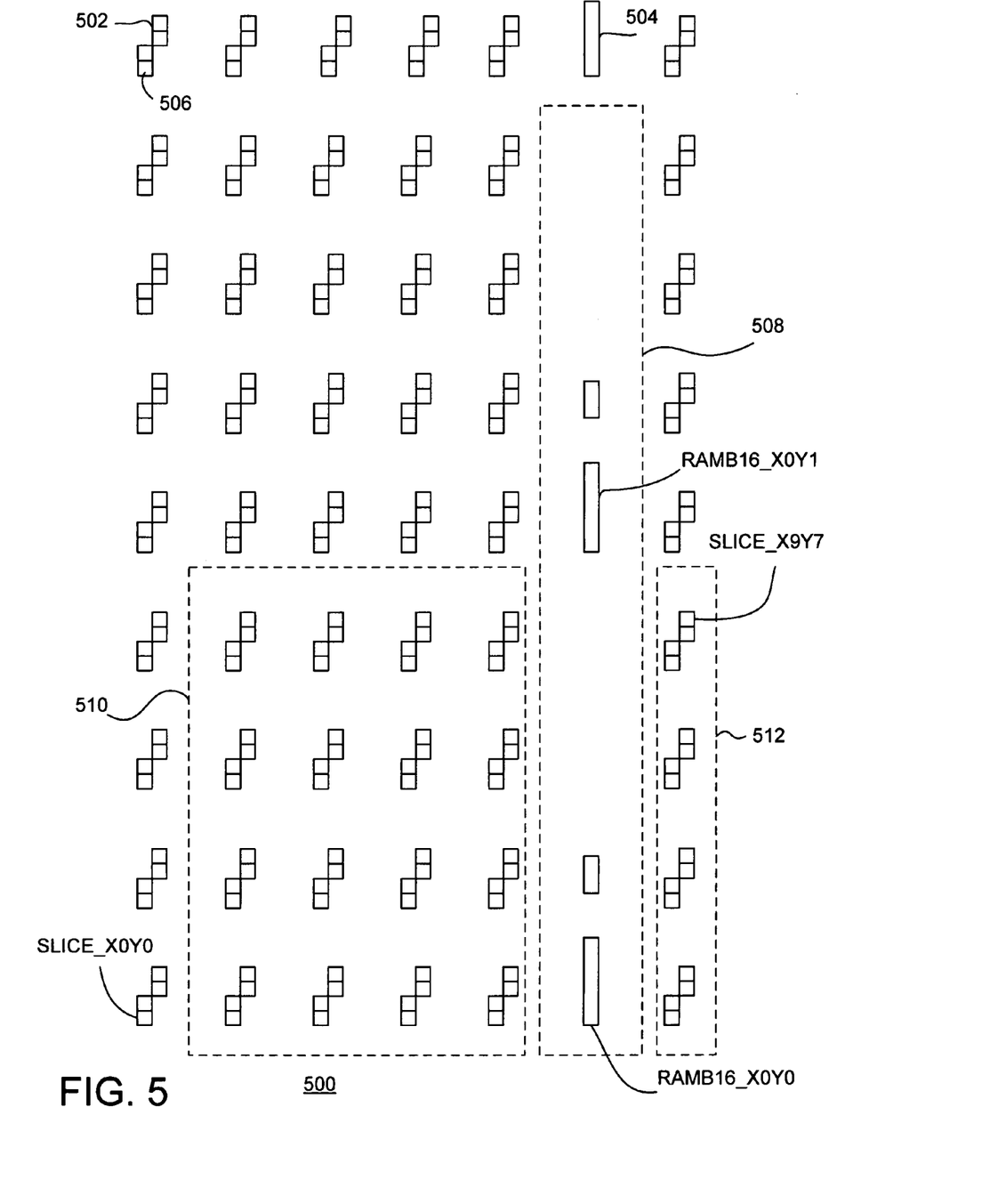
FIG. 5 is a block diagram depicting another exemplary floorplan portion for an FPGA in accordance with one or more aspects of the invention.

FIG. 5 is a block diagram depicting another exemplary floorplan portion 500 for an FPGA in accordance with one or more aspects of the invention. The floorplan portion 500 includes six columns of CLBs 502 and one column of BRAM 504. Each of the CLBs 502 is two slices wide by two slices tall, for a total of four slices 506 per CLB 502. Each BRAM 504 is as wide as a CLB 502, but is four CLBs 504 tall (eight slices 506 tall). In the present example, selected logic resources for a module include the slices in the range SLICE_X0Y0:SLICE_X9Y7, as well as the BRAMs in the range RAMB16_X0Y0:RAMB16_X0Y1. The slices in the range SLICE_X0Y8:SLICE_X9Y15 are not required to implement the module. Accordingly, a logic resource area constraint for the module is defined as a non-rectangular area encompassing the slices in the range SLICE_X0Y0:SLICE_X9Y7 and the BRAMs in the range RAMB16_X0Y0:RAMB16_X0Y1. The logic resource area constraint comprises the union of the regions 508, 510, and 512 corresponding to the selected logic. The slices in the range SLICE_X0Y8:SLICE_X9Y15 are in effect excluded from the logic resource area constraint and thus can be used by another portion of the circuit design (e.g., the static portion).

A routing resource area constraint for the module is defined to include routing resources associated with the slices in the slice range SLICE_X0Y0:SLICE_X9Y7 and the BRAMs in the range RAMB16_X0Y0: RAMB16_X0Y1 (i.e., the routing resources in the non-rectangular region). At least a portion of the programmable interconnect associated with the slices in the range SLICE_X0Y8:SLICE_X9Y15 may be required to be able to route the module and/or meet timing, and thus such portion may included in the routing resource area constraint for the module.

Figure 6:
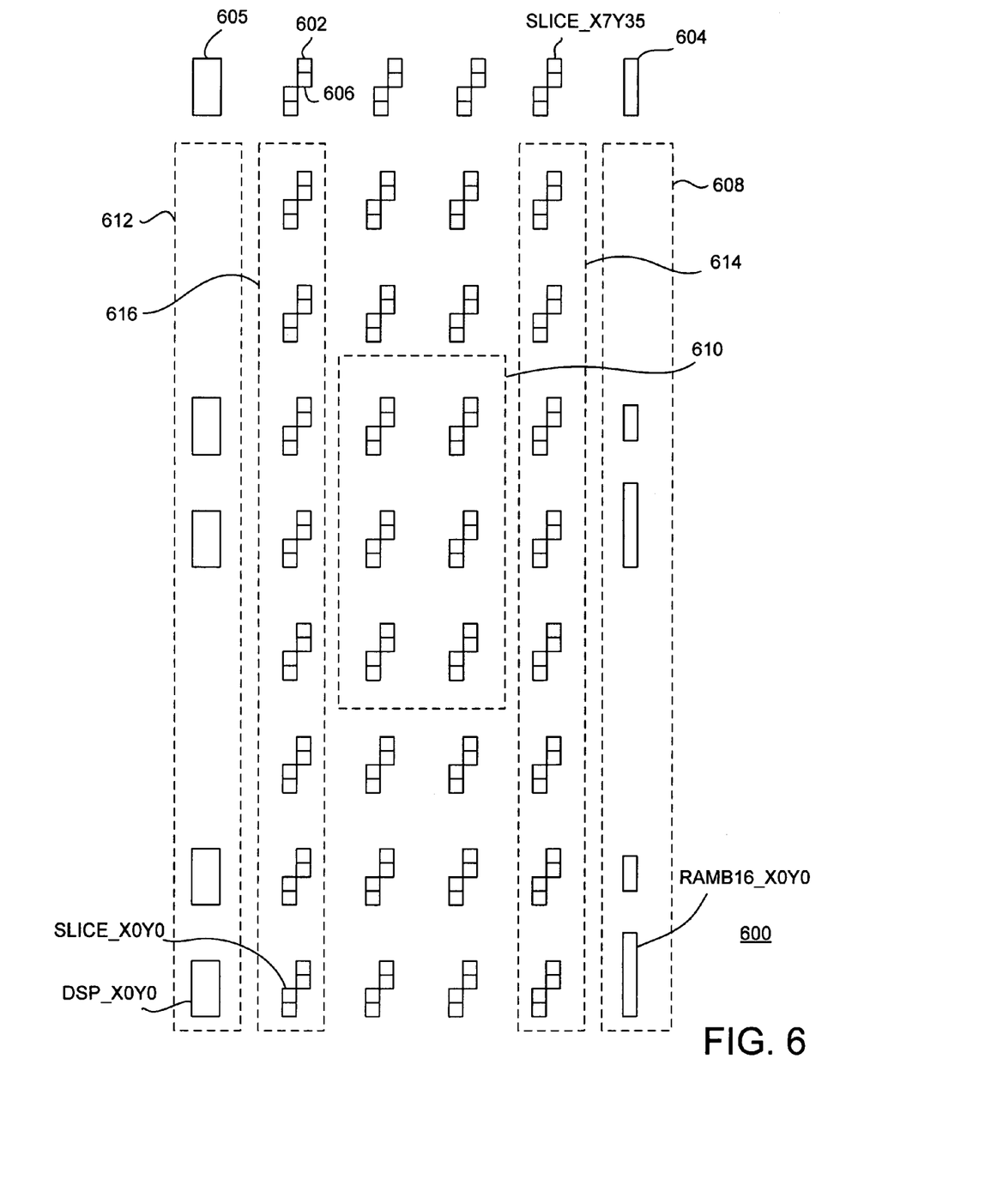
FIG. 6 is a block diagram depicting yet another exemplary floorplan portion for an FPGA in accordance with one or more aspects of the invention.

FIG. 6 is a block diagram depicting yet another exemplary floorplan portion 600 for an FPGA in accordance with one or more aspects of the invention. The floorplan portion 600 includes four columns of CLBs 602, one column of BRAM 604, and one column of DSPs 605. Each of the CLBs 602 is two slices wide by two slices tall, for a total of four slices 606 per CLB 602. Each BRAM 604 and each DSP 605 is as wide as a CLB 602, but is four CLBs 604 tall (eight slices 606 tall). In the present example, selected logic resources for a module include: (a) slices in the ranges SLICE_X0Y0: SLICE_X0Y31, SLICE_X2Y12:SLICE_X5Y23, and SLICE_X0Y0:SLICE_X6Y31; (b) BRAMs in the range RAMB16_X0Y0:RAMB16_X0Y1; and (c) DSPs in the range DSP_X0Y0:DSP_X0Y1. The slices in the range SLICE_X2Y0:SLICE_X5Y11 and the slices in the range SLICE_X2Y24:SLICEX5Y31 are not required to implement the module. Accordingly, a logic resource area constraint for the module is defined as a non-rectangular area encompassing the selected logic resources (e.g., an H-shaped region). The logic resource area constraint comprises the union of the regions 608, 610, 612, 614, and 616 corresponding to the selected logic. The slices in the ranges SLICE_X2Y0: SLICE_X5Y11 and SLICE_X2Y24:SLICEX5Y31 are in effect excluded from the logic resource area constraint and thus can be used by another portion of the circuit design (e.g., the static portion).

A routing resource area constraint for the module is defined to include routing resources associated with the selected logic resources. At least a portion of the programmable interconnect associated with the slices in the ranges SLICE_X2Y0: SLICE_X5Y11 and SLICE_X2Y24:SLICEX5Y31 may be required to be able to route the module and/or meet timing, and thus such portion may be included in the routing resource area constraint for the module.

Figure 7:
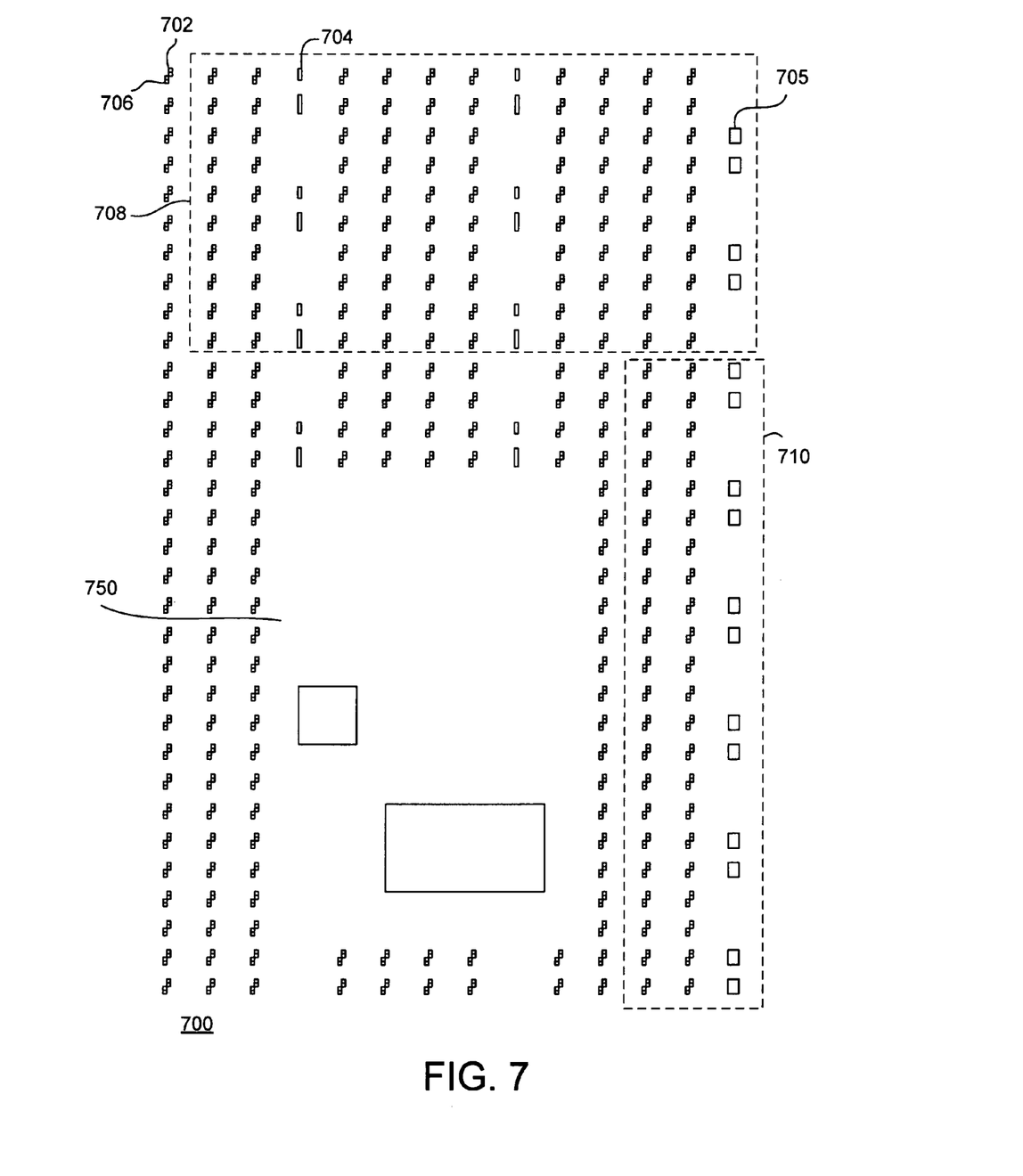
FIG. 7 is a block diagram depicting yet another exemplary floorplan portion for an FPGA in accordance with one or more aspects of the invention.

FIG. 7 is a block diagram depicting yet another exemplary floorplan portion 700 for an FPGA in accordance with one or more aspects of the invention. The floorplan portion 700 includes columns of CLBs 702, columns of BRAM 704, one column of DSPs 705, and a processor 750. Each of the CLBs 702 is two slices wide by two slices tall, for a total of four slices 706 per CLB 702. Each BRAM 704 and each DSP 705 is as wide as a CLB 702, but is four CLBs 704 tall (eight slices 706 tall). In the present example, selected logic resources for a module are located in regions 708 and 710. Accordingly, a logic resource area constraint for the module is defined as a non-rectangular area encompassing the selected logic resources, which is the union of the regions 708 and 710 (e.g., an L-shaped region). The processor 750 along with various CLBs and BRAMs are in effect excluded from the logic resource area constraint and thus can be used by another portion of the circuit design (e.g., the static portion). The routing resource area constraint for the module is defined to include routing resources associated with the logic resources in the L-shaped region. If additional routing resources are required to achieve routing and/or meet timing, such additional routing resources may be included in the routing resource area constraint.

Figure 8:
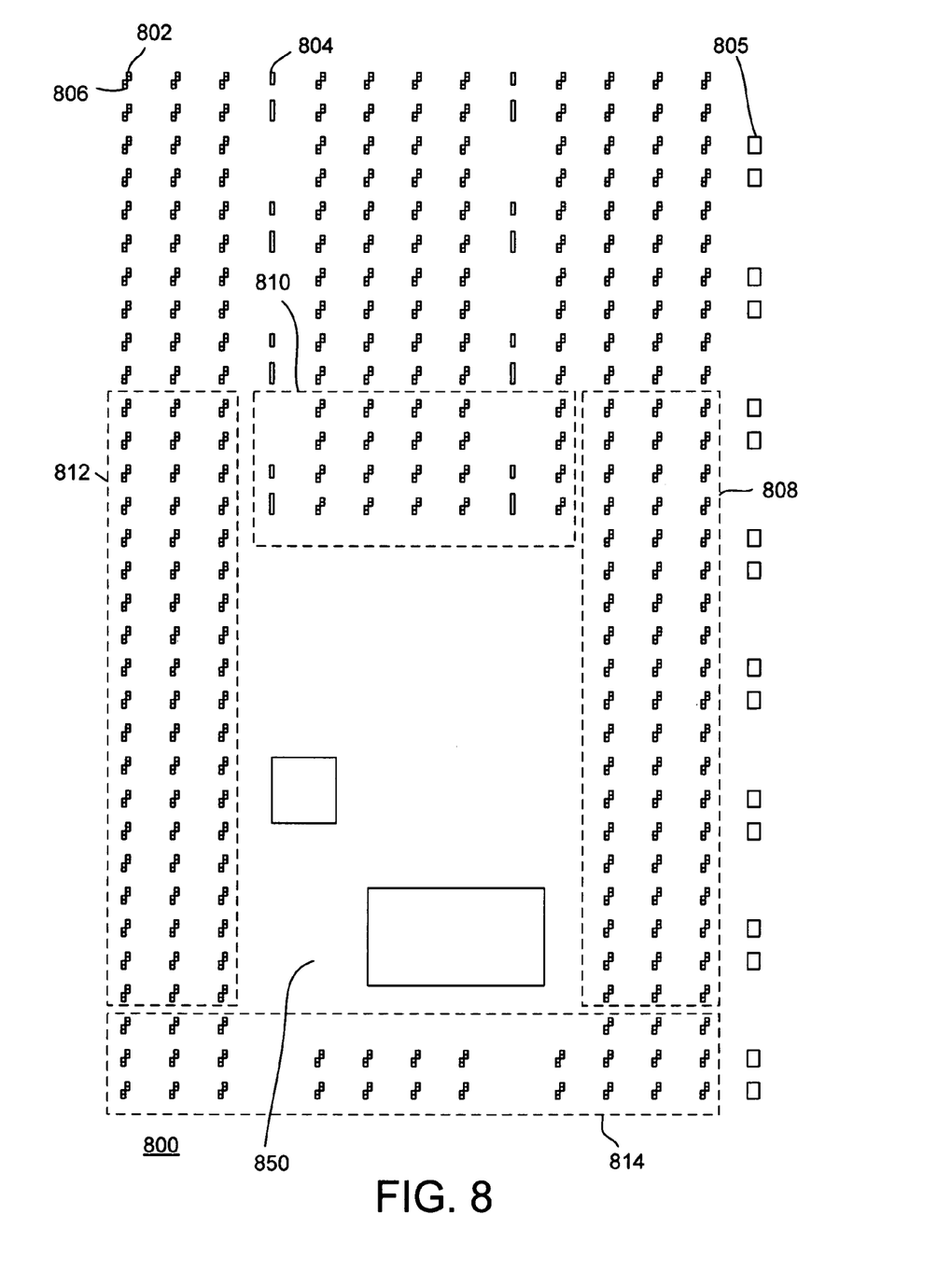
FIG. 8 is a block diagram depicting yet another exemplary floorplan portion for an FPGA in accordance with one or more aspects of the invention.

FIG. 8 is a block diagram depicting yet another exemplary floorplan portion 800 for an FPGA in accordance with one or more aspects of the invention. The floorplan portion 800 includes columns of CLBs 802, columns of BRAM 804, one column of DSPs 805, and a processor 850. Each of the CLBs 802 is two slices wide by two slices tall, for a total of four slices 806 per CLB 802. Each BRAM 804 and each DSP 805 is as wide as a CLB 802, but is four CLBs 804 tall (eight slices 806 tall). In the present example, selected logic resources for a module are located in regions 808, 810, 812, and 814. Accordingly, a logic resource area constraint for the module is defined as a non-rectangular area encompassing the selected logic resources, which is the union of the regions 808 through 814 (e.g., a gasket-shaped region surrounding the processor 850). The processor 850 is in effect excluded from the logic resource area constraint and thus can be used by another portion of the circuit design (e.g., the static portion). The routing resource area constraint for the module is defined to include at least a portion of routing resources associated with the logic resources in the gasket-shaped region. Notably, some routing resources in the gasket-shaped region may be excluded from the routing resource area constraint for the module so that another module may utilize the processor 850.

Figure 9:
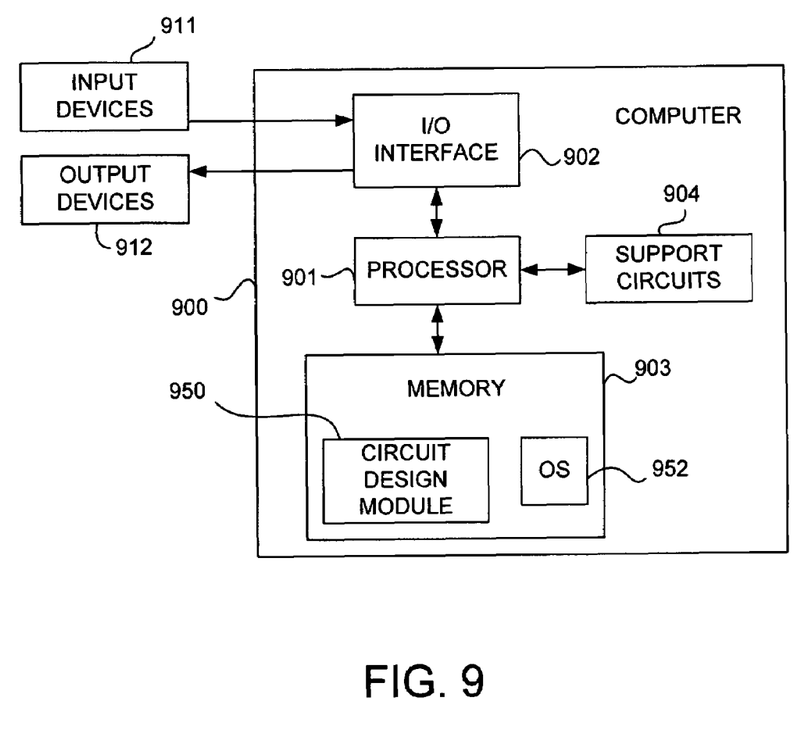
FIG. 9 is a block diagram depicting an exemplary embodiment of a computer suitable for implementing the processes described herein in accordance with one or more aspects of the invention.

FIG. 9 is a block diagram depicting an exemplary embodiment of a computer 900 suitable for implementing the processes described herein, in accordance with one or more aspects of the invention. The computer 900 includes a processor 901, a memory 903, various support circuits 904, and an I/O interface 902. The processor 901 may include, for example, one or more microprocessors known in the art. The support circuits 904 for the processor 901 can include conventional cache, power supplies, clock circuits, data registers, I/O interfaces, and the like. The I/O interface 902 may be directly coupled to the memory 903 or coupled through the processor 901, as shown in FIG. 9. The I/O interface 902 is coupled to various input devices 911 (e.g., keyboard, mouse, and the like) and output devices 912 (e.g., display, printer, and the like).

The memory 903 stores processor-executable instructions and/or data that may be executed by and/or used by the processor 901. These processor-executable instructions may comprise hardware, firmware, software, and the like, or some combination thereof. Modules having processor-executable instructions that are stored in the memory 903 include circuit design module 950. The circuit design module 950 is configured to implement the system 200 of FIG. 2 and the method 300 of FIG. 3. The computer 900 may be programmed with an operating system 952, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 903. The memory 903 may include one or more of the following: random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Programs of the program product define functions of embodiments and can be contained on a variety of media, which can include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD). Such media, when carrying computer-readable instructions that direct functions of the invention, represent computer readable media embodiments of the invention.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A computer-implemented method of implementing a circuit design for a programmable device, the method comprising:

selecting first logic resources for implementing a first module of the circuit design;
  defining, using a computer, a logic resource area constraint that reserves a non-rectangular region in a floorplan of the programmable device having the first logic resources; and
  defining, using the computer, a routing resource area constraint that reserves first routing resources associated with the first logic resources in the non-rectangular region.

2. The method of claim 1, wherein the defining the routing resource area constraint includes reserving second routing resources associated with second logic resources, the second logic resources being excluded from the non-rectangular region, the second routing resources being required for use of the first logic resources.

3. The method of claim 2, further comprising:
  reserving at least a portion of the second logic resources for implementing a second module of the circuit design.

4. The method of claim 3, wherein the first module comprises a reconfigurable module in the circuit design and the second module comprises a static portion of the circuit design.

5. The method of 4, further comprising:
  reserving third routing resources associated with at least one of the first logic resources or the second logic resources, for use by the second module to access the second logic resources.

6. The method of claim 1, wherein the non-rectangular region includes a first area reserving a first portion of the first logic resources and a second area reserving a second portion of the first logic resources, the first and the second areas being disjoint.

7. The method of claim 6, wherein the first portion and the second portion of the first logic resources are separated by a threshold distance.

8. An apparatus for implementing a circuit design for a programmable device, the apparatus comprising:

means for selecting first logic resources for implementing a first module of the circuit design;
  means for defining a logic resource area constraint that reserves a non-rectangular region in a floorplan of the programmable device having the first logic resources; and
  means for defining a routing resource area constraint that reserves first routing resources associated with the first logic resources in the non-rectangular region.

9. The apparatus of claim 8, wherein the means for defining the logic resource area constraint is further configured to reserve second routing resources associated with second logic resources, the second logic resources being excluded from the non-rectangular region, the second routing resources being required for use of the first logic resources.

10. The apparatus of claim 9, further comprising:
  means for reserving at least a portion of the second logic resources for implementing a second module of the circuit design.

11. The apparatus of claim 10, wherein the first module comprises a reconfigurable module in the circuit design and the second module comprises a static portion of the circuit design.

12. The apparatus of 11, further comprising:
  means for reserving third routing resources associated with at least one of the first logic resources or the second logic resources, for use by the second module to access the second logic resources.

13. The apparatus of claim 8, wherein the non-rectangular region includes a first area reserving a first portion of the first logic resources and a second area reserving a second portion of the first logic resources, the first and the second areas being disjoint.

14. The apparatus of claim 13, wherein the first portion and the second portion of the first logic resources are separated by a threshold distance.

15. A computer readable medium having stored thereon instructions that cause a processor to perform operations implementing a circuit design for a programmable device, the operations comprising:

selecting first logic resources for implementing a first module of the circuit design;
  defining a logic resource area constraint that reserves a non-rectangular region in a floorplan of the programmable device having the first logic resources; and
  defining a routing resource area constraint that reserves first routing resources associated with the first logic resources in the non-rectangular region.

16. The computer readable medium of claim 15, wherein the routing resource area constraint is further defined to reserve second routing resources associated with second logic resources, the second logic resources being excluded from the non-rectangular region, the second routing resources being required for use of the first logic resources.

17. The computer readable medium of claim 16, the operations further comprising:
  reserving at least a portion of the second logic resources for implementing a second module of the circuit design.

18. The computer readable medium of claim 17, wherein the first module comprises a reconfigurable module in the circuit design and the second module comprises a static portion of the circuit design.

19. The computer readable medium of 18, the operations further comprising:
  reserving third routing resources associated with at least one of: (a) the first logic resources or (b) the second logic resources, for use by the second module to access the second logic resources.

20. The computer readable medium of claim 15, wherein the non-rectangular region includes a first area reserving a first portion of the first logic resources and a second area reserving a second portion of the first logic resources, the first and the second areas being disjoint.

* * * * *